(12) United States Patent
Blalock

(10) Patent No.: US 6,652,764 B1
(45) Date of Patent: *Nov. 25, 2003

(54) METHODS AND APPARATUSES FOR MAKING AND USING PLANARIZING PADS FOR MECHANICAL AND CHEMICAL-MECHANICAL PLANARIZATION OF MICROELECTRONIC SUBSTRATES

(75) Inventor: Guy T. Blalock, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 137 days.

This patent is subject to a terminal disclaimer.

(21) Appl. No.: 09/652,639

(22) Filed: Aug. 31, 2000

(51) Int. Cl.$^7$ ................................................ B44C 1/22
(52) U.S. Cl. .......................... 216/88; 216/89; 438/692; 438/693; 451/56; 451/143; 451/444; 451/539; 451/57; 451/66
(58) Field of Search ................................. 438/692, 693; 216/88, 89; 451/56, 443, 444, 539, 57, 66

(56) References Cited

U.S. PATENT DOCUMENTS

| | | |
|---|---|---|
| 5,020,283 A | 6/1991 | Tuttle |
| 5,036,015 A | 7/1991 | Sandhu et al. |
| 5,069,002 A | 12/1991 | Sandhu et al. |
| 5,081,796 A | 1/1992 | Schultz |
| 5,177,908 A | 1/1993 | Tuttle |
| 5,196,353 A | 3/1993 | Sandhu et al. |
| 5,222,329 A | 6/1993 | Yu |
| 5,232,875 A | 8/1993 | Tuttle et al. |
| 5,234,867 A | 8/1993 | Schultz et al. |
| 5,240,552 A | 8/1993 | Yu et al. |
| 5,244,534 A | 9/1993 | Yu et al. |
| RE34,425 E | 11/1993 | Schultz |
| 5,297,364 A | 3/1994 | Tuttle |
| 5,314,843 A | 5/1994 | Yu et al. |
| 5,413,941 A | 5/1995 | Koos et al. |
| 5,421,769 A | 6/1995 | Schultz et al. |
| 5,433,651 A | 7/1995 | Lustig et al. |
| 5,439,551 A | 8/1995 | Meikle et al. |

(List continued on next page.)

OTHER PUBLICATIONS

Kondo, S. et al., "Abrasive–Free Polishing for Copper Damascene Interconnection," Journal of the Electrochemical Society, vol. 147, No. 10, pp. 3907–3913, 2000, The Electrochemical Society, Inc.

Primary Examiner—George Goudreau
(74) Attorney, Agent, or Firm—Perkins Coie LLP

(57) ABSTRACT

Methods and apparatuses for planarizing a microelectronic substrate. In one embodiment, a planarizing pad for mechanical or chemical-mechanical planarization includes a base section and a plurality of embedded sections. The base section has a planarizing surface, and the base section is composed of a first material. The embedded sections are arranged in a desired pattern of voids, and each embedded section has a top surface below the planarizing surface to define a plurality of voids in the base section. The embedded sections are composed of a second material that is selectively removable from the first material. A planarizing pad in accordance with an embodiment of the invention can be made by constructing the embedded sections in the base section and then removing a portion of the embedded sections from the base section. By removing only a portion of the embedded sections, this procedure creates the plurality of voids in the base section and leaves the remaining portions of the embedded sections. After the pad is used to planarize one or more substrate assemblies and the voids are filled with waste matter or otherwise altered, an etchant can be deposited on the pad to subsequently remove an incremental depth of the embedded sections faster than the base section to reform the voids over the embedded sections.

4 Claims, 8 Drawing Sheets

U.S. PATENT DOCUMENTS

| | | |
|---|---|---|
| 5,449,314 A | 9/1995 | Meikle et al. |
| 5,486,129 A | 1/1996 | Sandhu et al. |
| 5,514,245 A | 5/1996 | Doan et al. |
| 5,540,810 A | 7/1996 | Sandhu et al. |
| 5,609,718 A | 3/1997 | Meikle |
| 5,616,069 A | 4/1997 | Walker et al. |
| 5,618,381 A | 4/1997 | Doan et al. |
| 5,624,303 A | 4/1997 | Robinson |
| 5,643,048 A | 7/1997 | Iyer |
| 5,645,682 A | 7/1997 | Skrovan |
| 5,650,619 A | 7/1997 | Hudson |
| 5,655,951 A | 8/1997 | Meikle et al. |
| 5,658,190 A | 8/1997 | Wright et al. |
| 5,663,797 A | 9/1997 | Sandhu |
| 5,679,065 A | 10/1997 | Henderson |
| 5,679,169 A | 10/1997 | Gonzales et al. |
| 5,690,540 A | 11/1997 | Elliott et al. |
| 5,698,455 A | 12/1997 | Meikle et al. |
| 5,702,292 A | 12/1997 | Brunelli et al. |
| 5,725,417 A | 3/1998 | Robinson |
| 5,733,176 A | 3/1998 | Robinson et al. |
| 5,736,427 A | 4/1998 | Henderson |
| 5,738,562 A | 4/1998 | Doan et al. |
| 5,738,567 A | 4/1998 | Manzonie et al. |
| 5,747,386 A | 5/1998 | Moore |
| 5,777,739 A | 7/1998 | Sandhu et al. |
| 5,779,522 A | 7/1998 | Walker et al. |
| 5,782,675 A | 7/1998 | Southwick |
| 5,792,709 A | 8/1998 | Robinson et al. |
| 5,795,218 A | 8/1998 | Doan et al. |
| 5,795,495 A | 8/1998 | Meikle |
| 5,798,302 A | 8/1998 | Hudson et al. |
| 5,801,066 A | 9/1998 | Meikle |
| 5,823,855 A | 10/1998 | Robinson |
| 5,830,806 A | 11/1998 | Hudson et al. |
| 5,833,519 A | 11/1998 | Moore |
| 5,846,336 A | 12/1998 | Skrovan |
| 5,855,804 A | 1/1999 | Walker |
| 5,868,896 A | 2/1999 | Robinson et al. |
| 5,871,392 A | 2/1999 | Meikle et al. |
| 5,879,222 A | 3/1999 | Robinson |
| 5,879,226 A | 3/1999 | Robinson |
| 5,882,248 A | 3/1999 | Wright et al. |
| 5,893,754 A | 4/1999 | Robinson et al. |
| 5,894,852 A | 4/1999 | Gonzales et al. |
| 5,900,164 A * | 5/1999 | Budinger et al. ............. 216/88 |
| 5,910,043 A | 6/1999 | Manzonie et al. |
| 5,910,846 A | 6/1999 | Sandhu |
| 5,919,082 A * | 7/1999 | Walker et al. ................ 451/44 |
| 5,930,699 A | 7/1999 | Bhatia |
| 5,934,980 A | 8/1999 | Koos et al. |
| 5,936,733 A | 8/1999 | Sandhu et al. |
| 5,938,801 A | 8/1999 | Robinson |
| 5,945,347 A | 8/1999 | Wright |
| 5,954,912 A | 9/1999 | Moore |
| 5,967,030 A | 10/1999 | Blalock |
| 5,972,792 A | 10/1999 | Hudson |
| 5,975,994 A | 11/1999 | Sandhu et al. |
| 5,976,000 A | 11/1999 | Hudson |
| 5,980,363 A | 11/1999 | Meikle et al. |
| 5,981,396 A | 11/1999 | Robinson et al. |
| 5,989,470 A * | 11/1999 | Doan et al. ................ 264/261 |
| 5,990,012 A | 11/1999 | Robinson et al. |
| 5,994,224 A | 11/1999 | Sandhu et al. |
| 5,997,384 A | 12/1999 | Blalock |
| 6,004,196 A | 12/1999 | Doan et al. |
| 6,007,406 A | 12/1999 | Custer et al. |
| 6,007,408 A | 12/1999 | Sandhu |
| 6,036,586 A | 3/2000 | Ward |
| 6,039,633 A | 3/2000 | Chopra |
| 6,040,245 A | 3/2000 | Sandhu et al. |
| 6,046,111 A | 4/2000 | Robinson |
| 6,054,015 A | 4/2000 | Brunelli et al. |
| 6,057,602 A | 5/2000 | Hudson et al. |
| 6,062,958 A | 5/2000 | Wright et al. |
| 6,083,085 A | 7/2000 | Lankford |
| 6,090,475 A | 7/2000 | Robinson et al. |
| 6,106,351 A | 8/2000 | Raina et al. |
| 6,108,092 A | 8/2000 | Sandhu |
| 6,110,820 A | 8/2000 | Sandhu et al. |
| 6,114,706 A | 9/2000 | Meikle et al. |
| 6,120,354 A | 9/2000 | Koos et al. |
| 6,124,207 A | 9/2000 | Robinson et al. |
| 6,135,856 A | 10/2000 | Tjaden et al. |
| 6,136,043 A | 10/2000 | Robinson et al. |
| 6,139,402 A | 10/2000 | Moore |
| 6,143,123 A | 11/2000 | Robinson et al. |
| 6,176,763 B1 | 1/2001 | Kramer et al. |
| 6,184,571 B1 | 2/2001 | Moore |
| 6,186,870 B1 | 2/2001 | Wright et al. |
| 6,187,681 B1 | 2/2001 | Moore |
| 6,190,494 B1 | 2/2001 | Dow |
| 6,191,037 B1 | 2/2001 | Robinson et al. |
| 6,191,864 B1 | 2/2001 | Sandhu |
| 6,193,588 B1 | 2/2001 | Carlson et al. |
| 6,196,899 B1 | 3/2001 | Chopra et al. |
| 6,200,196 B1 | 3/2001 | Custer et al. |
| 6,200,901 B1 | 3/2001 | Hudson et al. |
| 6,203,407 B1 | 3/2001 | Robinson |
| 6,203,413 B1 | 3/2001 | Skrovan |
| 6,206,754 B1 | 3/2001 | Moore |
| 6,206,756 B1 | 3/2001 | Chopra et al. |
| 6,206,757 B1 | 3/2001 | Custer et al. |
| 6,206,759 B1 | 3/2001 | Agarwal et al. |
| 6,206,769 B1 | 3/2001 | Walker |
| 6,208,425 B1 | 3/2001 | Sandhu et al. |
| 6,210,257 B1 | 4/2001 | Carlson |
| 6,213,845 B1 | 4/2001 | Elledge |
| 6,217,422 B1 * | 4/2001 | Franca et al. ................ 451/56 |
| 6,220,934 B1 | 4/2001 | Sharples et al. |
| 6,227,955 B1 | 5/2001 | Custer et al. |
| 6,234,877 B1 | 5/2001 | Koos et al. |
| 6,234,878 B1 | 5/2001 | Moore |
| 6,237,483 B1 | 5/2001 | Blalock |
| 6,238,270 B1 | 5/2001 | Robinson |
| 6,238,273 B1 | 5/2001 | Southwick |
| 6,244,944 B1 | 6/2001 | Elledge |
| 6,250,994 B1 | 6/2001 | Chopra et al. |
| 6,251,785 B1 | 6/2001 | Wright |
| 6,254,460 B1 * | 7/2001 | Walker et al. ................ 451/41 |
| 6,261,151 B1 | 7/2001 | Sandhu et al. |
| 6,261,163 B1 | 7/2001 | Walker et al. |
| 6,267,650 B1 | 7/2001 | Hembree |
| 6,271,139 B1 | 8/2001 | Alwan et al. |
| 6,273,101 B1 | 8/2001 | Gonzales et al. |
| 6,273,786 B1 | 8/2001 | Chopra et al. |
| 6,273,796 B1 | 8/2001 | Moore |
| 6,273,800 B1 | 8/2001 | Walker et al. |
| 6,276,996 B1 | 8/2001 | Chopra |
| 6,277,015 B1 | 8/2001 | Robinson et al. |
| 6,284,660 B1 | 9/2001 | Doan |
| 6,287,879 B1 | 9/2001 | Gonzales et al. |
| 6,290,572 B1 | 9/2001 | Hofmann |
| 6,290,579 B1 * | 9/2001 | Walker et al. ................ 451/41 |
| 6,296,557 B1 | 10/2001 | Walker |
| 6,301,006 B1 | 10/2001 | Doan |
| 6,306,008 B1 | 10/2001 | Moore |
| 6,306,012 B1 | 10/2001 | Sabde |
| 6,306,014 B1 | 10/2001 | Walker et al. |
| 6,309,282 B1 | 10/2001 | Wright et al. |
| 6,312,558 B2 | 11/2001 | Moore |

| | | |
|---|---|---|
| 6,313,038 B1 | 11/2001 | Chopra et al. |
| 6,319,420 B1 | 11/2001 | Dow |
| 6,323,046 B1 | 11/2001 | Agarwal |
| 6,325,702 B2 | 12/2001 | Robinson |
| 6,328,632 B1 | 12/2001 | Chopra |
| 6,331,135 B1 | 12/2001 | Sabde et al. |
| 6,331,139 B2 | 12/2001 | Walker et al. |
| 6,331,488 B1 | 12/2001 | Doan et al. |
| 6,350,180 B2 | 2/2002 | Southwick |
| 6,350,691 B1 | 2/2002 | Lankford |
| 6,352,466 B1 | 3/2002 | Moore |
| 6,352,470 B2 | 3/2002 | Elledge |
| 6,354,919 B2 | 3/2002 | Chopra |
| 6,354,923 B1 | 3/2002 | Lankford |
| 6,354,930 B1 | 3/2002 | Moore |
| 6,358,122 B1 | 3/2002 | Sabde et al. |
| 6,358,127 B1 | 3/2002 | Carlson et al. |
| 6,361,400 B2 | 3/2002 | Southwick |
| 6,361,411 B1 | 3/2002 | Chopra et al. |
| 6,361,413 B1 | 3/2002 | Skrovan |
| 6,361,417 B2 | 3/2002 | Walker et al. |
| 6,361,832 B1 | 3/2002 | Agarwal et al. |
| 6,362,105 B1 | 3/2002 | Moore |
| 6,364,746 B2 | 4/2002 | Moore |
| 6,364,749 B1 | 4/2002 | Walker |
| 6,364,757 B2 | 4/2002 | Moore |
| 6,368,193 B1 | 4/2002 | Carlson et al. |
| 6,368,194 B1 | 4/2002 | Sharples et al. |
| 6,368,197 B2 | 4/2002 | Elledge |
| 6,409,586 B2 * | 6/2002 | Walker et al. ............... 451/527 |
| 6,126,523 A1 * | 10/2002 | Moriyasu et al. ............. 451/56 |
| 2002/0124958 A1 | 9/2002 | Blalock |
| 2002/0127496 A1 | 9/2002 | Blalock |
| 2002/0127958 A1 | 9/2002 | Blalock |

* cited by examiner

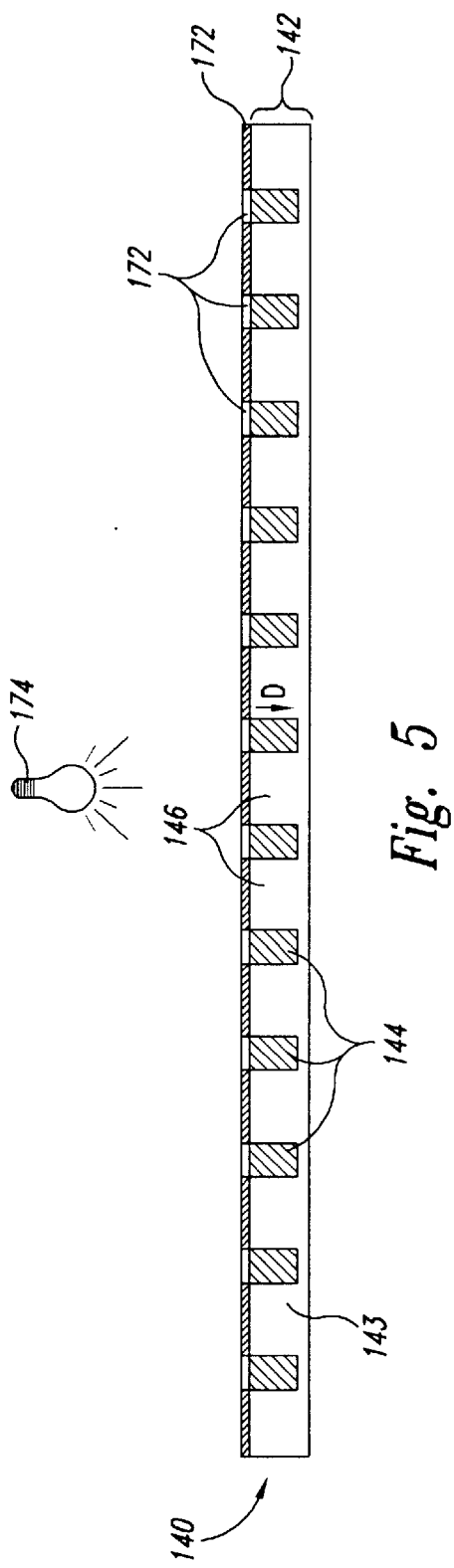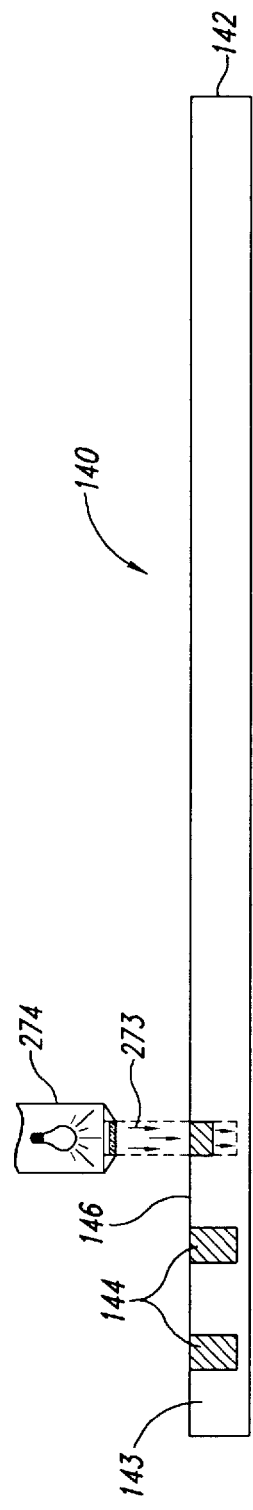

METHODS AND APPARATUSES FOR MAKING AND USING PLANARIZING PADS FOR MECHANICAL AND CHEMICAL-MECHANICAL PLANARIZATION OF MICROELECTRONIC SUBSTRATES

TECHNICAL FIELD

This invention relates to planarizing pads in mechanical and/or chemical-mechanical planarization of microelectronic substrates.

BACKGROUND

Mechanical and chemical-mechanical planarization processes (collectively "CMP") are used in the manufacturing of electronic devices for forming a flat surface on semiconductor wafers, field emission displays and many other microelectronic device substrate assemblies. CMP processes generally remove material from a substrate assembly to create a highly planar surface at a precise elevation in the layers of material on the substrate assembly. FIG. 1 schematically illustrates an existing web-format planarizing machine 10 for planarizing a substrate 12. The planarizing machine 10 has a support table 14 with a top-panel 16 at a workstation where an operative portion (A) of a planarizing pad 40 is positioned. The top-panel 16 is generally a rigid plate to provide a flat, solid surface to which a particular section of the planarizing pad 40 may be secured during planarization.

The planarizing machine 10 also has a plurality of rollers to guide, position and hold the planarizing pad 40 over the top-panel 16. The rollers include a supply roller 20, idler rollers 21, guide rollers 22, and a take-up roller 23. The supply roller 20 carries an unused or pre-operative portion of the planarizing pad 40, and the take-up roller 23 carries a used or post-operative portion of the planarizing pad 40. Additionally, the left idler roller 21 and the upper guide roller 22 stretch the planarizing pad 40 over the top-panel 16 to hold the planarizing pad 40 stationary during operation. A motor (not shown) generally drives the take-up roller 23 to sequentially advance the planarizing pad 40 across the top-panel 16, and the motor can also drive the supply roller 20. Accordingly, clean pre-operative sections of the planarizing pad 40 may be quickly substituted for used sections to provide a consistent surface for planarizing and/or cleaning the substrate 12.

The web-format planarizing machine 10 also has a carrier assembly 30 that controls and protects the substrate 12 during planarization. The carrier assembly 30 generally has a substrate holder 32 to pick up, hold and release the substrate 12 at appropriate stages of the planarizing process. Several nozzles 33 attached to the substrate holder 32 dispense a planarizing solution 44 onto a planarizing surface 42 of the planarizing pad 40. The carrier assembly 30 also generally has a support gantry 34 carrying a drive assembly 35 that can translate along the gantry 34. The drive assembly 35 generally has an actuator 36, a drive shaft 37 coupled to the actuator 36, and an arm 38 projecting from the drive shaft 37. The aim 38 carries the substrate holder 32 via a terminal shaft 39 such that the drive assembly 35 orbits the substrate holder 32 about an axis B—B (as indicated by arrow $R_1$). The terminal shaft 39 may also rotate the substrate holder 32 about its central axis C—C (as indicated by arrow $R_2$).

The planarizing pad 40 and the planarizing solution 44 define a planarizing medium that mechanically and/or chemically-mechanically removes material from the surface of the substrate 12. The planarizing pad 40 used in the web-format planarizing machine 10 is typically a fixed-abrasive planarizing pad in which abrasive particles are fixedly bonded to a suspension material. In fixed-abrasive applications, the planarizing solution is a "clean solution" without abrasive particles because the abrasive particles are fixedly distributed across the planarizing surface 42 of the planarizing pad 40. In other applications, the planarizing pad 40 may be a non-abrasive pad without abrasive particles that is composed of a polymeric material (e.g., polyurethane) or other suitable materials. The planarizing solutions 44 used with the non-abrasive planarizing pads are typically CMP slurries with abrasive particles and chemicals to remove material from a substrate.

To planarize the substrate 12 with the planarizing machine 10, the carrier assembly 30 presses the substrate 12 against the planarizing surface 42 of the planarizing pad 40 in the presence of the planarizing solution 44. The drive assembly 35 then orbits the substrate holder 32 about the axis B—B, and optionally rotates the substrate holder 32 about the axis C—C, to translate the substrate 12 across the planarizing surface 42. As a result, the abrasive particles and/or the chemicals in the planarizing medium remove material from the surface of the substrate 12.

The CMP processes should consistently and accurately produce a uniformly planar surface on the substrate assembly to enable precise fabrication of circuits and photo-patterns. During the fabrication of transistors, contacts, interconnects and other features, many substrate assemblies develop large "step heights" that create a highly topographic surface across the substrate assembly. Such highly topographical surfaces can impair the accuracy of subsequent photolithographic procedures and other processes that are necessary for forming sub-micron features. For example, it is difficult to accurately focus photo patterns to within tolerances approaching 0.1 micron on topographic substrate surfaces because sub-micron photolithographic equipment generally has a very limited depth of field. Thus, CMP processes are often used to transform a topographical substrate surface into a highly uniform, planar substrate surface at various stages of manufacturing the microelectronic devices.

One problem with conventional CMP methods is that the planarizing surface 42 of the planarizing pad 40 can wear unevenly or become glazed with accumulations of slurry and/or material removed from the substrate 12 or the planarizing pad 40. One conventional approach to address this problem is to condition the planarizing pad 40 by abrading the planarizing surface 42 with an abrasive disk (not shown). In a typical conditioning cycle, the abrasive disk removes accumulations of waste matter and also removes a layer of material from the pad 40. A drawback with this approach is that the equipment required for conditioning the planarizing pad 40 adds complexity to the planarizing machine 10. Moreover, if the conditioning operation is performed separately from the planarizing operation, it reduces the time that the planarizing pad 40 is available for planarizing substrates. Conventional conditioning processes can thus limit the overall efficiency and throughput of the apparatus.

An additional drawback of methods that condition pads with a conditioning stone is that it is difficult to condition pads with grooves or small voids without destroying the grooves. Conditioning stones, for example, may produce inconsistent distributions of grooves on the planarizing surface of a planarizing pad from one planarizing cycle to another. Conditioning stones may also change the depth or the width of existing grooves over the life of a planarizing pad. Conditioning planarizing pads with conditioning stones may thus produce a non-uniform or inconsistent distribution of slurry under a microelectronic device substrate assembly. Therefore, conditioning stones often cause planarizing pads to produce inconsistent polishing rates over the life of the pads.

One approach to address this drawback is to eliminate the need to condition the pad by making the planarizing surface or the entire planarizing pad disposable. For example, U.S. Pat. No. 6,139,402, which is herein incorporated by reference, discloses a disposable planarizing pad film made from materials such as Mylar or polycarbonate. The pads disclosed in U.S. Pat. No. 6,139,402 can have microfeatures of different heights that entrap small volumes of an abrasive slurry and maintain the slurry in contact with the substrate. The microfeatures can be formed using a variety of techniques, such as embossing or photo-patterning. Although disposable pads have many good applications, they do not address the problems of conditioning non-disposable pads with conditioning stones, and the disposable pads may not be suitable for all CMP applications. Therefore, there is still a need for developing planarizing pads and conditioning processes that provide consistent results over the life of non-disposable planarizing pads.

SUMMARY OF THE INVENTION

The present invention is directed toward planarizing pads for planarizing microelectronic substrates, planarizing machines with planarizing pads, methods for making planarizing pads, and methods for planarizing the microelectronic substrates. In one embodiment, a planarizing pad for mechanical or chemical-mechanical planarization includes a base section and a plurality of embedded sections. The base section has a planarizing surface and it is composed of a first material. The embedded sections are arranged in a desired pattern of voids or grooves for holding a desired distribution of planarizing solution under a substrate assembly. Each embedded section has a top surface below the planarizing surface to define a void in the base section. As such, the plurality of embedded sections define a pattern of voids in the base section. The embedded sections are composed of a second material that is selectively removable from the first material.

One process for making a planarizing pad in accordance with an embodiment of the invention includes forming a pad body by constructing the embedded sections in the base section. This embodiment for making a planarizing pad can further include removing an incremental portion of the embedded sections from the base section without removing all of the material of the embedded sections. By removing only an incremental portion of the embedded sections, this procedure creates the plurality of voids in the base section and leaves the remaining portions of the embedded sections in the base section. After the pad is used to planarize one or more substrate assemblies and the voids are filled with waste matter or the planarizing surface wears down, an etchant can be deposited on the pad to subsequently etch another incremental portion of the embedded sections faster than the base section to reform the voids over the embedded sections. The planarizing pad can thus be chemically conditioned in manner that provides a consistent pattern and size of voids over the life of the planarizing pad.

In one particular embodiment for making a planarizing pad, the pad body initially comprises a photo-sensitive material that becomes more soluble in a selected etchant upon exposure to a particular radiation (e.g., light). The procedure for constructing the embedded sections in the base section can comprise irradiating portions of the base section corresponding to the desired pattern of voids with the selected radiation. The unexposed portions of the pad body can define the first material of the base section, and the exposed portions of the pad body can change into the second material to define the embedded sections. The exposure time of the light is set to change the first material into the second material to the selected depth within the base section. The embedded sections generally extend to depth that is greater than the desired depth of the voids to provide enough of the second material for incrementally reforming the voids over several conditioning cycles.

BRIEF DESCRIPTION OF DRAWINGS

FIG. 5 is a schematic side cross-sectional view of a method for manufacturing the planarizing pad in accordance with one embodiment of the invention.

FIG. 6 is a schematic side cross-sectional view of a method for manufacturing a planarizing pad in accordance with another embodiment of the invention.

DETAILED DESCRIPTION OF EMBODIMENTS OF THE INVENTION

The present disclosure describes planarizing pads, methods for making planarizing pads, and methods for mechanical and/or chemical-mechanical planarization of semiconductor wafers, field emission displays and other types of microelectronic device substrate assemblies. The term "substrate assembly" includes both base substrates without microelectronic components and substrates having assemblies of microelectronic components. Many specific details of certain embodiments of the invention are set forth in the following description, and in FIGS. 2–9, to provide a thorough understanding of these embodiments. One skilled in the art, however, will understand that the present invention may have additional embodiments, or that the invention may be practiced without several of the details described below.

Figure 1:
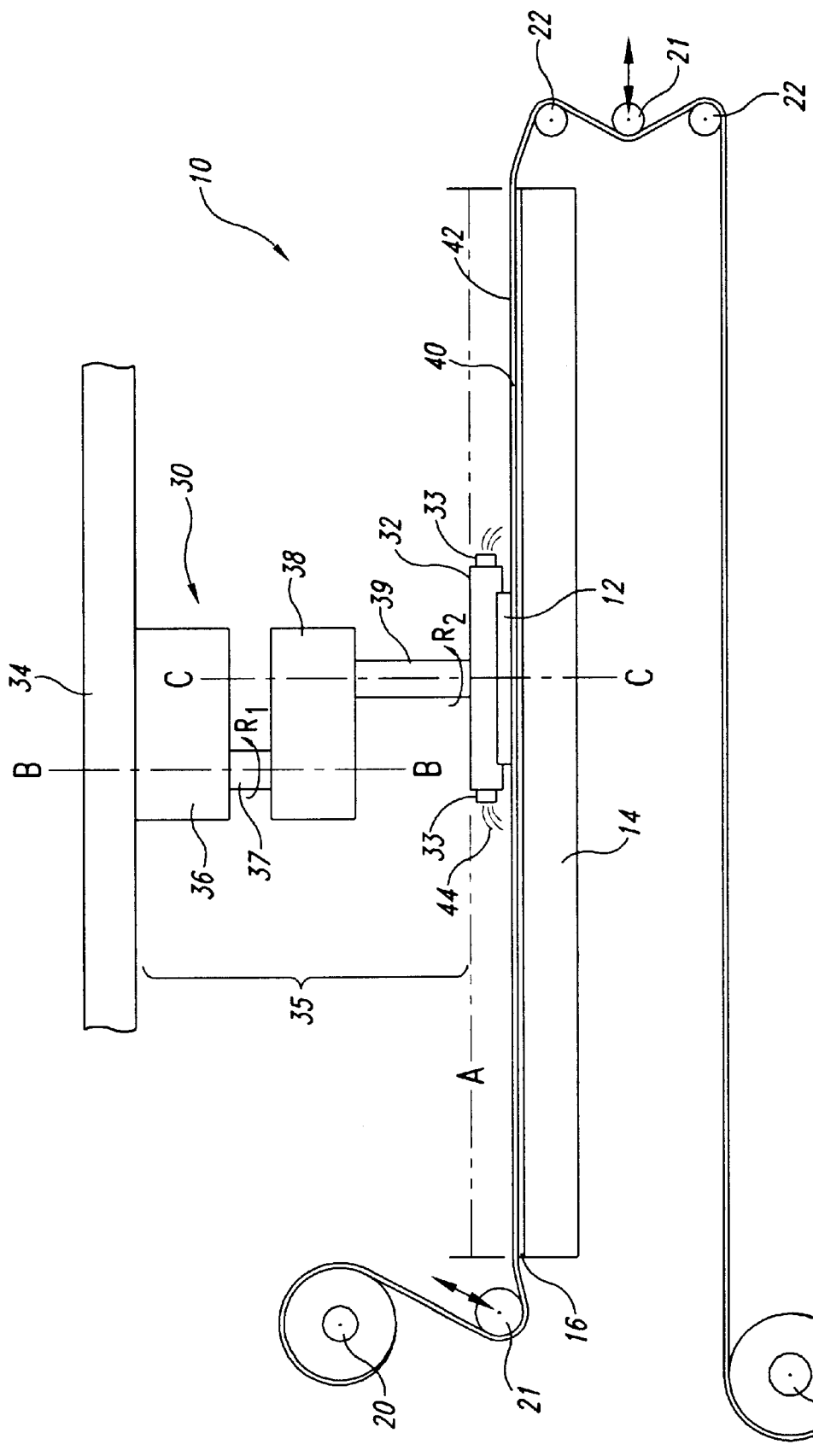
FIG. 1 is a partial schematic side of elevational view of a planarizing apparatus in accordance with the prior art.
Figure 2:
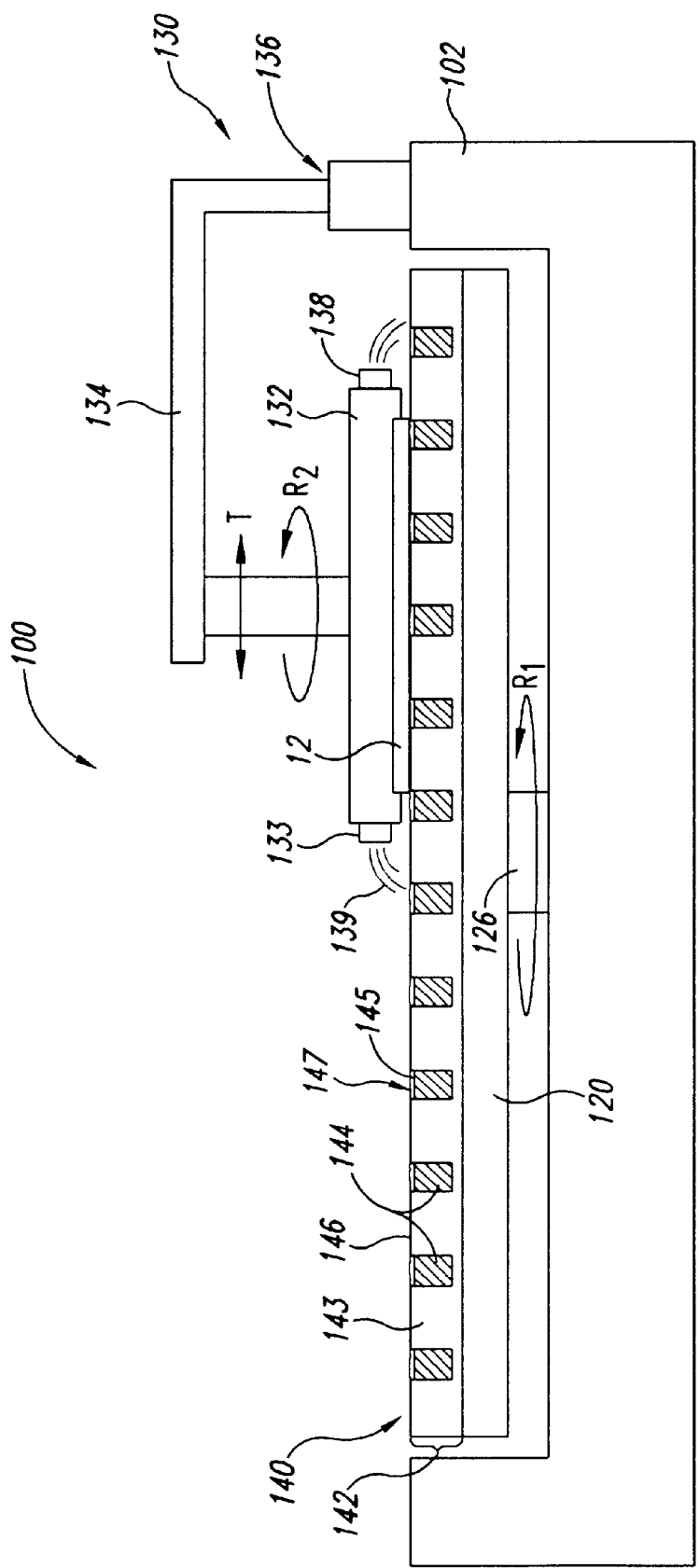
FIG. 2 is a schematic side elevational view illustrating a planarizing machine including a planarizing pad in accordance with one embodiment of the invention.

FIG. 2 is a cross-sectional view schematically illustrating a planarizing machine 100 with a planarizing pad 140 in accordance with one embodiment of the invention. The planarizing machine 100 is a rotary machine including a platen 120 attached to a drive assembly 126 that rotates the platen 120 (arrow $R_1$) or translates the platen 120 horizontally (not shown). The planarizing machine 100 also includes a carrier assembly 130 having a substrate holder 132, an arm 134 carrying the substrate holder, and a drive assembly 136 coupled to the arm 134. The substrate holder 132 can include a plurality of nozzles 133 to dispense a planarizing solution 139 onto the planarizing pad 140. In operation, the substrate holder 132 holds a substrate assembly 12, and the drive assembly 136 moves the substrate assembly 12 by rotating (arrow $R_2$) and/or translating (arrow T) the substrate holder 132.

The planarizing pad 140 has a pad body 142 including a base section 143 and a plurality of embedded sections 144 in the base section 143. The base section 143 has a planarization surface defined by one or more planarizing regions 146. The embedded sections 144 have top surfaces 145 below planarizing regions 146 of the base section 143. The difference in height between the planarizing regions 146 and the top surfaces 145 defines a plurality of voids 147 in the base section 143 over the embedded sections 144. The planarizing regions 146 contact the substrate 12 during a planarizing cycle, and the voids 147 extend below the planarizing regions 146 to hold small volumes of the planarizing solution 139 under the substrate 12. The voids 147 can be grooves, shallow wells or other structures that hold the planarizing solution 139 under the substrate 12. The voids 147 are arranged in a desired void pattern to provide a predetermined distribution of the planarizing solution 139 under the substrate 12. As explained in more detail below, the embedded sections 144 are arranged in the desired pattern of the voids to ensure that the void pattern is consistently maintained over the life of the planarizing pad 140.

The base section 143 comprises a first material and the embedded sections 144 comprise a second material. The first and second materials have at least one different physical property and/or chemical property that makes the second material selectively removable from the first material. As used herein, the term "selectively removable" generally means that a selected solution dissolves or otherwise removes the second material of the embedded sections 144 faster than the first material of the base section 143. The first and second materials can initially be the same compound or two different compounds. When the first and second materials are initially the same compound, the compound is treated so that a property of the substance is changed in the base section 143 and/or the embedded sections 144 to either make the base section 143 less soluble or the embedded sections 144 more soluble in the selected solution. The pad body 142, for example, can be composed of a photosensitive material that is exposed to a selected radiation to change the property of the photo-sensitive material in either the base section 143 or the embedded sections 144. When the first and second materials are different compounds, the base section 143 is composed of a first compound and the embedded sections 144 are composed of a second compound that is more soluble in the selected solution.

Figure 3:
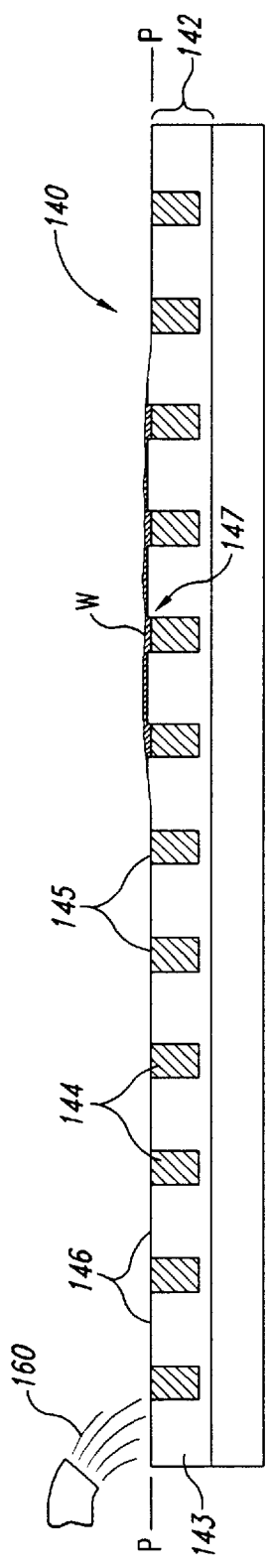
FIG. 3 is a schematic side elevational view of a planarizing pad at one stage of a conditioning cycle in accordance with one embodiment of a method of the invention.
Figure 4:
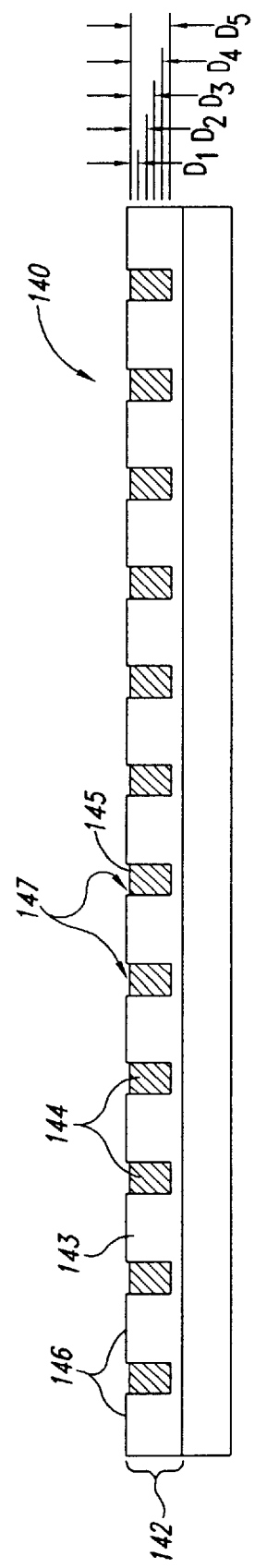
FIG. 4 is a schematic side elevational view of the planarizing pad at another stage of a conditioning cycle in accordance with an embodiment of a method of the invention.

FIGS. 3 and 4 illustrate conditioning the planarizing pad 140 to provide a consistent pattern of grooves or other voids over the life of the pad. FIG. 3, more specifically, shows the planarizing pad 140 after planarizing one or more substrates 12, but before conditioning the planarizing pad 140. During planarization, the substrate 12 can wear down the planarizing regions 146 to approximately the level of the top surfaces 145 of the embedded regions 144, or waste matter W may glaze over certain regions of the planarizing pad 140. The waste matter W is especially problematic in applications that planarize borophosphate silicon glass (BPSG) or other relatively soft materials. In either situation, the planarizing surface of the planarizing pad 140 changes so that the voids 147 in the base section 143 are either shallower or completely eliminated. The planarizing pad 140 must accordingly be conditioned to return the planarizing surface to a state that is acceptable for planarizing additional substrates 12.

To conditioning the planarizing pad 140, a selected conditioning solution 160 is dispensed on the planarizing pad 140. The conditioning solution 160 can be an etchant or another solution that dissolves or otherwise removes the second material of the embedded sections 144 faster than the first material of the base section 143. The conditioning solution 160 accordingly reforms the voids 147 over the embedded sections 144 by incrementally removing a portion of the embedded sections 144 each conditioning cycle. In a preferred embodiment, the planarizing pad 140 is planarized to a level P—P before dispensing the conditioning solution 160 onto the planarizing pad 140 to remove the waste matter W and to make the planarizing regions 146 coplanar with the top surfaces 145 of the embedded sections 144. Referring to FIG. 4, the conditioning solution 160 then etches material from the embedded sections 144 to incrementally lower the top surfaces 145 of the embedded sections 144 below the surface of the planarizing regions 146. Each conditioning cycle can thus incrementally lower the top surfaces 145 of the embedded sections 144 by pre-determined increments $D_1$, $D_2$, $D_3$, $D_4$, $D_5$ and so on.

One advantage of several embodiments of the planarizing pad 140 illustrated in FIGS. 3 and 4 is that they provide a consistent pattern of voids or grooves over the life of the planarizing pad. By arranging the embedded portions 144 in the desired pattern of voids, and by forming the embedded portions 144 to have a depth significantly greater than the depth of the voids 147, the second material of the embedded sections 144 can be incrementally etched multiple times to consistently reform the voids 147. The reformed voids 147 can accordingly have the same pattern, width and depth to provide a consistent distribution of the planarizing solution 139 under the substrate 12. Several embodiments of the planarizing pad 140 are thus expected to provide more consistent planarizing results than conventional planarizing pads because they generally eliminate one variable of the planarizing process that typically changes over life of the planarizing pad (e.g., the consistency of the voids).

Another advantage of several embodiments of the planarizing pad 140 illustrated in FIGS. 3 and 4 is that these pads are expected to have long operating lives. One aspect of certain embodiments of the planarizing pad 140 is that the pad 140 can be conditioned several times without changing the pattern or configuration of the voids 147. The operational life of the planarizing pad 140 is accordingly defined, at least in part, by the depth of the embedded sections 144 in the base section 143. The pad body 142 can thus be relatively thick so that the planarizing pad 140 can be conditioned several times before it expires. Therefore, several embodiments of the polishing pad 140 illustrated in FIGS. 3 and 4 are expected to have long operating lives.

FIG. 5 is a schematic cross-sectional view of a stage in one embodiment of a method for making the planarizing pad 140. In this embodiment, the pad body 142 is a photosensitive compound that changes when it is exposed to light or other sources of radiation. The radiation, for example, changes the exposed area of the photo-sensitive compound to be more soluble in a selected chemical etchant. Suitable photo-sensitive substances that become more soluble when exposed to UV light include UV sensitive modified polyurethane. In one embodiment, the UV sensitive modified polyurethane has a photo-acid generator that terminates the polyurethane groups with phenol groups, and then the compound is subject to esterification. The photo-acid generator, for example, can be sulfonium salt. Upon irradiation, the photo-acid generator breaks apart and releases an acid that forms groups that are soluble in a solution (e.g., ester groups that are soluble in a base). The etchant can accordingly be in the hydroxide group, such as ammonium hydroxide ($NH_3OH$).

The method continues by placing a mask 170 on the top surface of the pad body 142. The mask 170 has an opaque section 171 and a plurality of transmissive sections 172 (e.g., apertures). The transmissive sections 172 are arranged in the pattern of the voids 147 for the planarizing pad 140. After the mask 170 is positioned over the pad body 142, a radiation source 174 irradiates the exposed areas of the pad body 142 under the transmissive sections 172 with a selected radiation to change the property of the is exposed areas of the photo-sensitive material. The particular radiation from the radiation source 174 is selected-according to the photo properties of the photo-sensitive substance of the pad body or 142. Additionally, the intensity of the selected radiation and the time of exposure is selected to control the depth D of the material changed by the irradiation.

The exposed areas of the pad body 142 in this embodiment accordingly define the embedded sections 144, and the non-exposed areas of the pad body 144 define the base section 143. Suitable procedures for forming the embedded sections 144 include illuminating a pad body 142 of UV sensitive modified material with UV radiation at approximately 300 nm. After exposing the pad body 142 to the selected radiation, an etchant or another type of selected solution is disposed on the planarizing pad 140 to remove the second material of the embedded sections 144 faster than the first material of the base section 143. The resulting planarizing pad 140 accordingly has a plurality of voids 147 over the embedded sections 144 (as shown in FIG. 4).

In an alternate embodiment of the process illustrated in FIG. 5, the photo-sensitive substance of the pad body 142 can be changed in planarizing regions 146 to be less soluble in a selected solution. In this embodiment, the transmissive sections in the mask are positioned over the desired areas of the planarizing regions 146 and the opaque sections are patterned to correspond to the pattern of the embedded sections 144 described above with reference to FIG. 5. As described above with reference to FIG. 5, an etchant or other selected solution is disposed on the planarizing pad 140 to selectively etch the second material of the embedded sections 144 faster than the first material of the base section 143.

FIG. 6 is a schematic cross-sectional view of a stage in another embodiment of a method for making the planarizing pad 140. In this embodiment, the pad body 142 is composed of a photo-sensitive material, and the method includes irradiating either the embedded sections 144 or the planarizing sections 146 of the pad body 142 with a highly directional beam 273 from a laser 274 or other radiation source. This embodiment for making the polishing had 140 accordingly changes the photo-sensitive material so that the base section 143 is composed of the first material and the embedded sections 144 are composed of the second material. After irradiating the pad body 142 with the laser 274, an etchant or another type of solution is disposed on the planarizing pad 140 to selectively etch the voids.

Figure 7A:
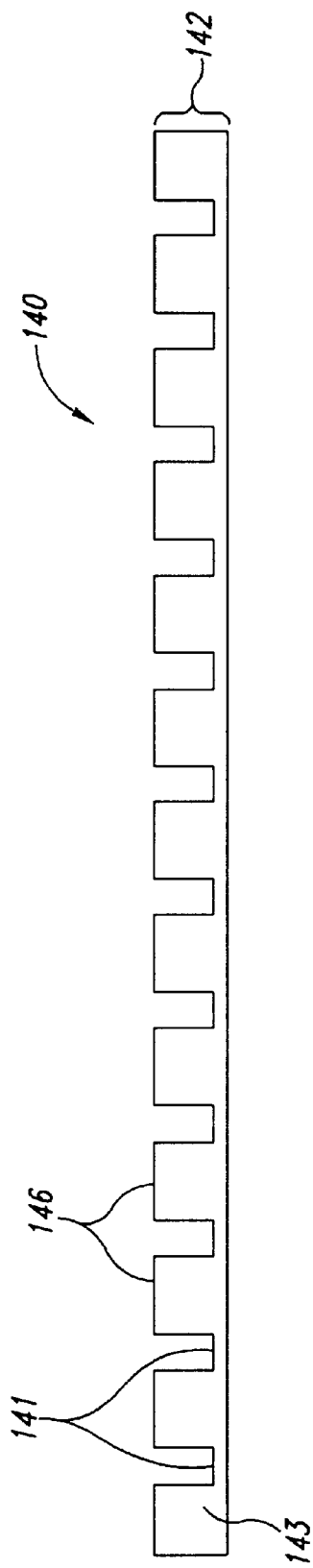
FIGS. 7A–7D are partial schematic side cross-sectional views of a method for manufacturing the planarizing pad in accordance with another embodiment of the invention.
Figure 7B:
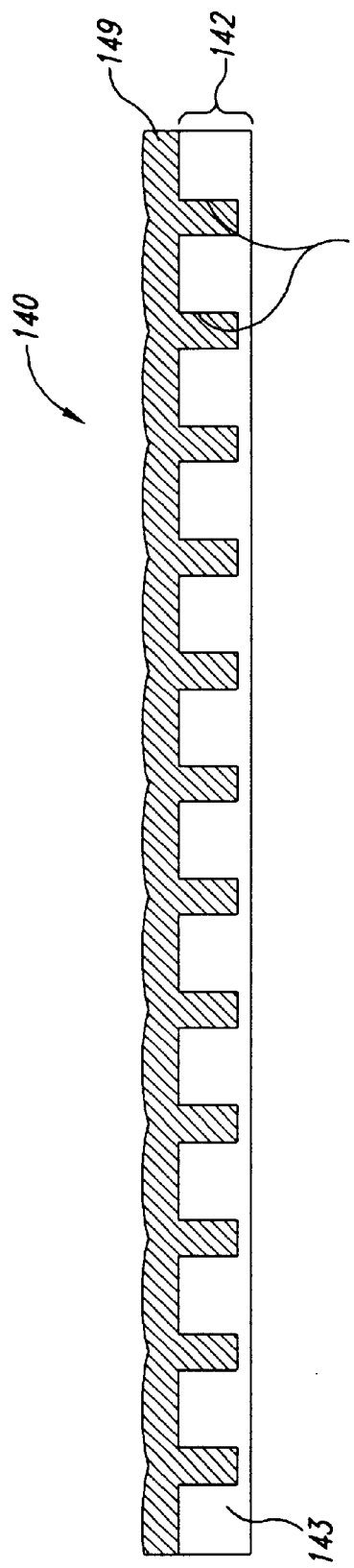
Figure 7C:
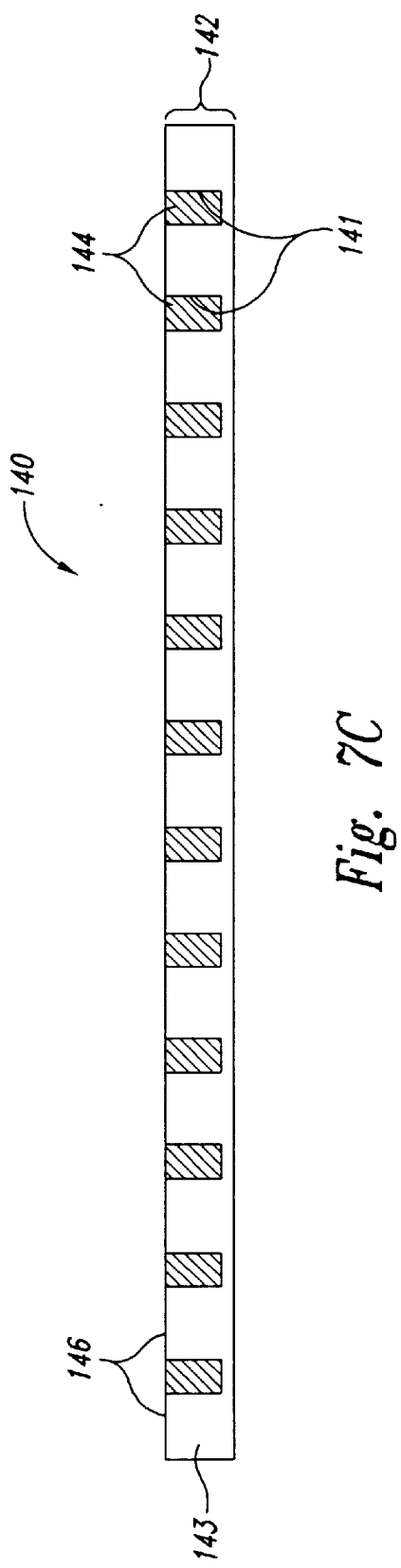

FIGS. 7A–7D illustrate-another method for manufacturing the planarizing pad 140 in accordance with another embodiment of the invention. Referring to FIG. 7A, a plurality of deep depressions 141 are initially formed in the pad body 142 to define the planarizing regions 146 of the base section 143. The deep depressions 141 generally have a depth corresponding to the depth of the embedded sections 144 (FIG. 5), and the depressions 141 are arranged in the desired pattern of voids for the planarizing pad 140. The deep depressions 141 can be formed by stamping or etching the pad body 142. Referring to FIG. 7B, a cover layer 149 is then formed over the base section 143 to fill the depressions 141. Referring to FIG. 7C, the pad body 142 is then planarized to remove the upper portion of the cover layer 149 so that the remaining portions of the cover layer 149 are isolated from one another in the depressions 141. The original material of the pad body 142 in which the depressions 141 were formed constitutes the base section 143, and the remaining portions of the cover layer 149 in the depressions 141 after planarizing the pad constitute the embedded sections 144.

Figure 7D:
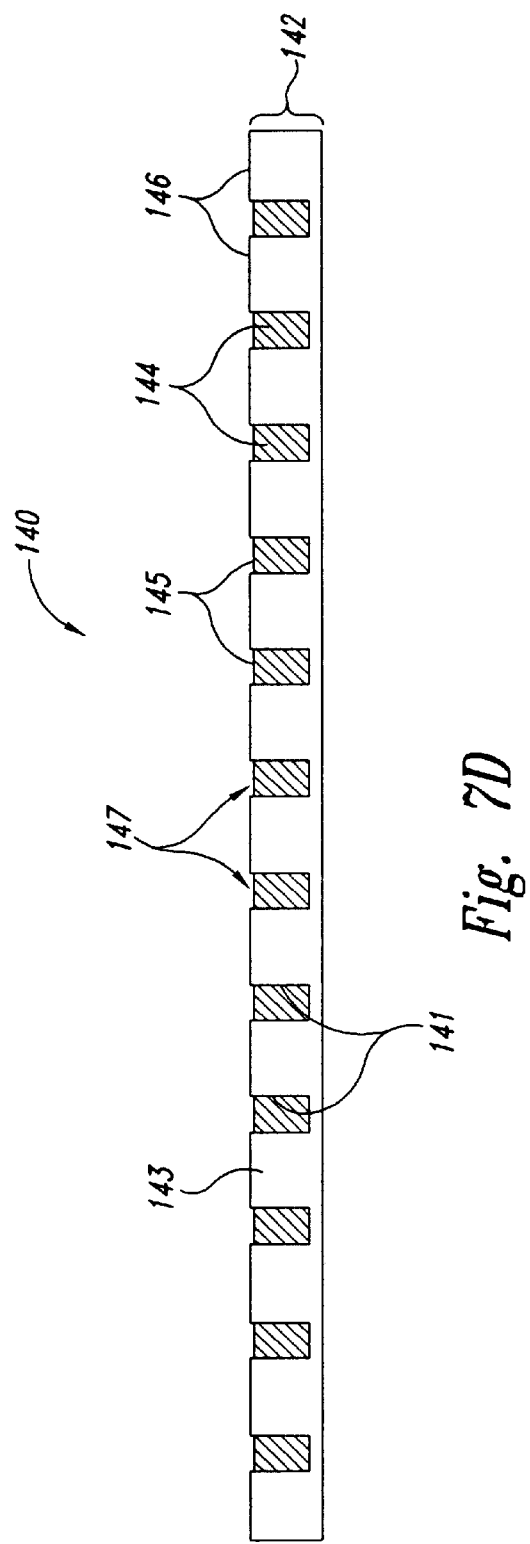

In the embodiment of the planarizing pad 140 shown in FIGS. 7A–7C, the first material of the base section 143 and the second material of the embedded sections 144 can be different compounds or substances. The first material, for example, can include polyurethane, resin, polyester or other materials. The first material can be a material that is not readily attacked by a strong oxidizer. The second material can include nylon, polycarbonate, polystyrene, butadiene acrylonitrile or other materials. The second material can be a material that is readily attacked by a strong oxidizer. The first and second materials are selected so that the second material is selectively removable from the first material by a selected etchant or other solution. The etchant, for example, can be a strong oxidizer, such as peroxide or ozonated water. Referring to FIG. 7D, an etchant or selected solution is disposed on the planarized planarizing pad 140 shown in FIG. 7C to etch the voids 147 above the embedded sections 144.

Figure 8A:
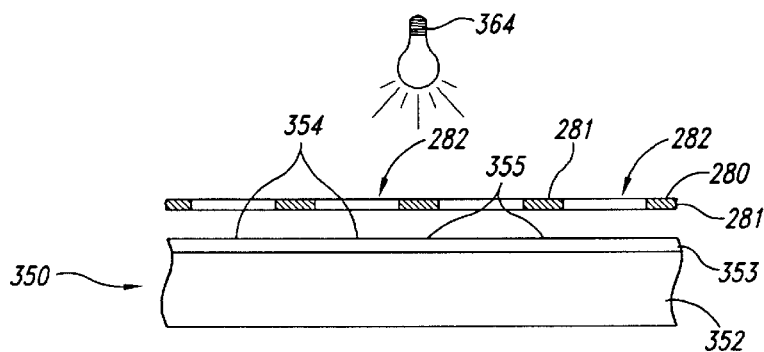
FIGS. 8A–8E are schematic side elevational views illustrating a portion of a photo-polymer composite undergoing a photo-etching process in accordance with an embodiment of the invention.

FIGS. 8A–8E illustrate a method for photo-patterning and etching the deep depressions 141 in the pad body 142. As shown in FIG. 8A, a photopolymer composite 350 is formed by disposing a photopolymer resist material 353 on a substrate polymer 351. The photopolymer resist material 353 is then exposed to a radiation source 364. A mask 280 has opaque portions 281 to block the radiation emitted from the radiation source 364 from striking unexposed portions 355 of the photopolymer resist material 353, and the mask 280 has transmissive portions 282 through which the radiation passes to strike exposed portions 354 of the resist material 353.

Figure 8B:
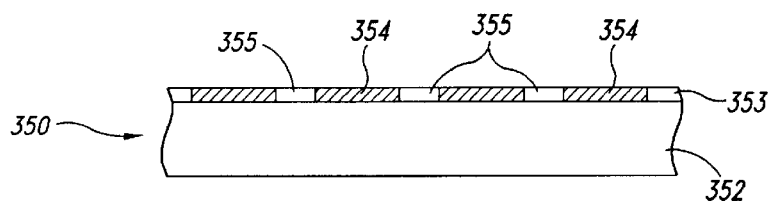

As shown schematically in FIG. 8B, the radiation source 263 changes chemical characteristics of the exposed portions 354. For example, when the photopolymer resist material 353 is initially insoluble in a selected solvent, exposure to the selected radiation can change the exposed portions 354 to become soluble in the selected solvent. Alternatively, when the photopolymer resist material is initially soluble in the selected solvent, exposure to the selected radiation can make the exposed portions 354 insoluble. In either case, the solubility of the unexposed portions 355 remains unchanged.

Figure 8C:
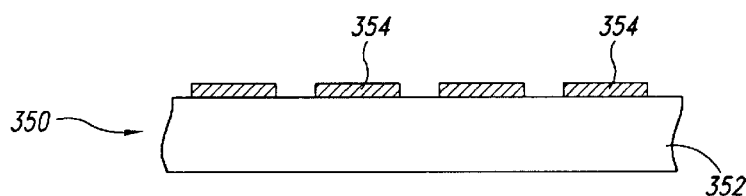

When the exposed portions 354 are rendered insoluble by exposure to the selected radiation, FIG. 8C schematically illustrates the photopolymer composite 350 after being rinsed with the selected solvent. The exposed portions 354 of the photopolymer resist material 353 remain intact and the unexposed portions 355 (FIG. 8B) have been removed by the solvent to expose the substrate polymer 352 below. The substrate polymer 352 is then etched to remove the portions of the substrate polymer material between the exposed portions 354 and form the deep depressions 141

Figure 8D:
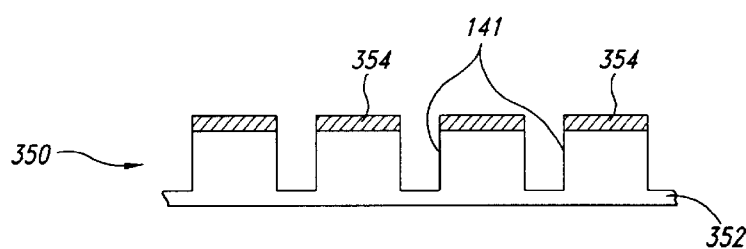
Figure 8E:
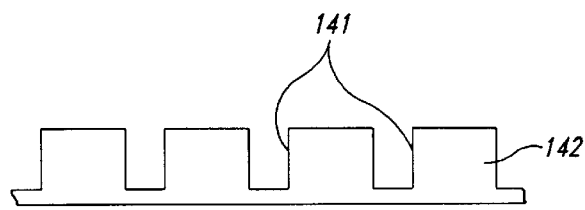

(FIG. 8D). The exposed portions 354 of the photopolymer resist material 353 are then removed to form the pad body 142 with the deep depressions 141. The pad body 142 shown in FIG. 8D is then processed as explained above with reference to FIGS. 7B–7D.

Figure 9:
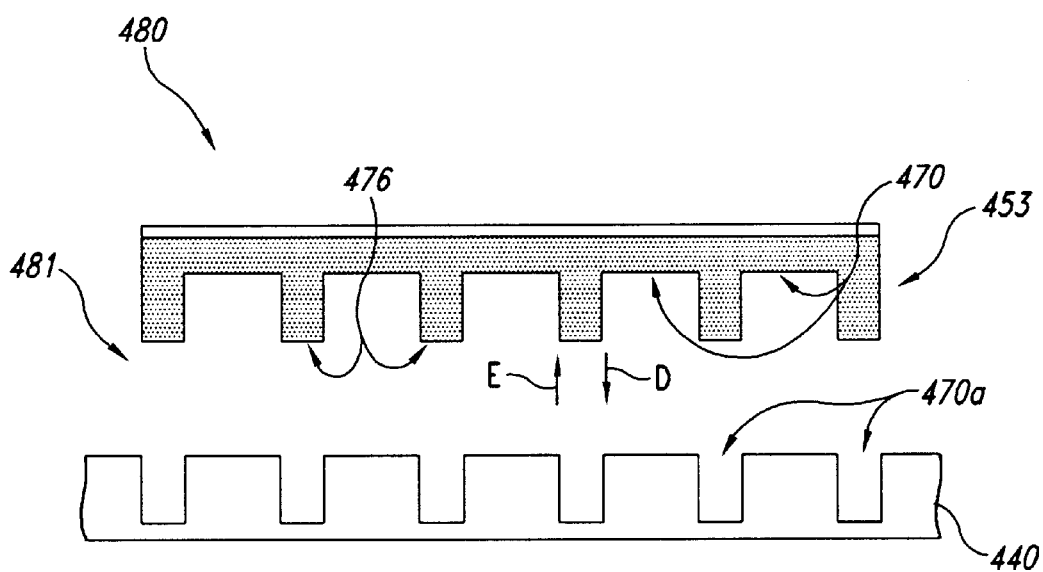
FIG. 9 is a partial schematic side cross-sectional view of a stage in a method for manufacturing the planarizing pads illustrated in FIGS. 7A–7D.

FIG. 9 is a schematic cross-sectional view of another procedure for forming the depressions 141 in the first material of the pad body 142. In this embodiment, a press 480 is driven against the pad body 142 while the pad body 142 is in a deformable state. The pad body 142, for example, can be heated or formed from a flowable material that can be hardened using heat and/or chemical curing processes. The press 480 includes a plate 481 having a plurality of projections 482 and recesses 489 between the projections 482. The projections 482 accordingly form the deep depressions 141, and the recesses 489 form the planarizing regions 146. The stamped pad body 142 is then cooled or otherwise cured to harden the pad body 142 to a useable state. The hardened pad body 142 can then be processed as explained above with reference to FIGS. 7B–7D.

From the foregoing it will be appreciated that even though specific embodiments of the invention have been described herein for purposes of illustration, various modifications may be made without deviating from the spirit and scope of the invention. For example, the planarizing pad 140 can also be a web-format pad for use on a web-format planarizing machine. Accordingly, the invention is not limited except as by the appended claims.

What is claimed is:

1. A method of planarizing a microelectronic device substrate assembly, comprising:
providing a planarizing pad having a base section having a planarizing surface of a first material, a plurality of embedded sections of a second material in the first material, and a plurality of voids in the first material above the embedded sections, the voids extending below the planarizing surface, and the second material being selectively removable from the first material by a selected solution;
pressing the microelectronic device substrate assembly against the planarizing surface in the presence of a planarizing solution on the planarizing pad and in the voids;
moving at least one of the planarizing pad and/or the microelectronic device substrate assembly relative to one another; and
conditioning the planarizing pad between planarizing cycles by removing an incremental layer of the pad body to form a surface in which the base section has an upper surface and the embedded sections have top surfaces generally co-planar with the upper surface of the base section; and selectively etching an additional incremental portion of the second material in the embedded sections faster than the upper surface of the base section to reform voids in the base section over the embedded sections.

2. A method of planarizing a microelectronic device substrate assembly, comprising:
providing a planarizing pad having a base section having a planarizing surface of a first material, a plurality of embedded sections of a second material in the first material, and a plurality of voids in the first material above the embedded sections, the voids extending below the planarizing surface, and the second material being selectively removable from the first material by a selected solution;
pressing the microelectronic device substrate assembly against the planarizing surface in the presence of a planarizing solution on the planarizing pad and in the voids;
moving at least one of the planarizing pad and/or the microelectronic device substrate assembly relative to one another; and
conditioning the planarizing pad between planarizing cycles by removing an incremental layer of the pad body to form a surface in which the base section has an upper surface and the embedded sections have top surfaces generally co-planar with the upper surface of the base section; and depositing a chemical solution on the pad body to remove an additional incremental portion of the second material in the embedded sections faster than the upper surface of the base section to reform voids in the base section over the embedded sections.

3. A method of planarizing a microelectronic device substrate assembly, comprising:
disposing a planarizing solution onto a planarizing surface of a planarizing pad to at least partially fill voids over embedded sections of the pad, the embedded sections being arranged in a desired pattern of voids in a first material, wherein the base section is composed of a first material and the embedded sections are composed of a second material that is selectively removable from the first material by a selected solution;
removing material from the substrate assembly by pressing the microelectronic device substrate assembly against the planarizing pad and moving at least one of the planarizing pad and/or the microelectronic device substrate assembly relative to the other; and
conditioning the planarizing pad between planarizing cycles by removing an incremental layer of the pad body to form a surface in which the base section has an upper surface and the embedded sections have top surfaces generally co-planar with the upper surface of the base section; and selectively etching an additional incremental portion of the second material in the embedded sections faster than the upper surface of the base section to reform voids in the base section over the embedded sections.

4. A method of planarizing a microelectronic device substrate assembly, comprising:
disposing a planarizing solution onto a planarizing surface of a planarizing pad to at least partially fill voids over embedded sections of the pad, the embedded sections being arranged in a desired pattern of voids in a first material, wherein the base section is composed of a first material and the embedded sections are composed of a second material that is selectively removable from the first material by a selected solution;
removing material from the substrate assembly by pressing the microelectronic device substrate assembly against the planarizing pad and moving at least one of the planarizing pad and/or the microelectronic device substrate assembly relative to the other; and
conditioning the polishing pad between planarizing cycles by removing an incremental layer of the pad body to form a surface in which the base section has an upper surface and the embedded sections have top surfaces generally co-planar with the upper surface of the base section; and depositing a chemical solution on the pad body to remove an additional incremental portion of the second material in the embedded sections faster than the upper surface of the base section to reform voids in the base section over the embedded sections.

* * * * *

UNITED STATES PATENT AND TRADEMARK OFFICE
CERTIFICATE OF CORRECTION

PATENT NO. : 6,652,764 B1  Page 1 of 1
APPLICATION NO. : 09/652639
DATED : November 25, 2003
INVENTOR(S) : Guy T. Blalock It is certified that error appears in the above-identified patent and that said Letters Patent is hereby corrected as shown below:

Column 1
Line 60, "aim" should be --arm--;

Column 7
Line 21, delete "is" between "the" and "exposed";

Signed and Sealed this

Seventh Day of July, 2009

JOHN DOLL
*Acting Director of the United States Patent and Trademark Office*